United States Patent
So et al.

(10) Patent No.: US 11,889,758 B2
(45) Date of Patent: Jan. 30, 2024

(54) ORGANIC LIGHT EMITTING DIODE HAVING AN EMITTER LAYER WITH A HOST AND AN EMITTER AND HAVING A TRIPLET INJECTION LAYER COMPRISING THE EMITTER, AND METHODS OF USE THEREOF

(71) Applicant: NORTH CAROLINA STATE UNIVERSITY, Raleigh, NC (US)

(72) Inventors: Franky So, Raleigh, NC (US); Amin Salehi, Raleigh, NC (US); Felix N. Castellano, Raleigh, NC (US)

(73) Assignee: NORTH CAROLINA STATE UNIVERSITY, Raleigh, NC (US)

( * ) Notice: Subject to any disclaimer, the term of this patent is extended or adjusted under 35 U.S.C. 154(b) by 666 days.

(21) Appl. No.: 17/045,563

(22) PCT Filed: Apr. 3, 2019

(86) PCT No.: PCT/US2019/025523
§ 371 (c)(1),
(2) Date: Oct. 6, 2020

(87) PCT Pub. No.: WO2019/195383
PCT Pub. Date: Oct. 10, 2019

(65) Prior Publication Data
US 2021/0036240 A1    Feb. 4, 2021

Related U.S. Application Data

(60) Provisional application No. 62/653,653, filed on Apr. 6, 2018.

(51) Int. Cl.
*H10K 85/60* (2023.01)
*C09K 11/06* (2006.01)
(Continued)

(52) U.S. Cl.
CPC .......... *H10K 85/6572* (2023.02); *C09K 11/06* (2013.01); *H10K 85/615* (2023.02);
(Continued)

(58) Field of Classification Search
CPC ............. H10K 85/6572; H10K 85/621; H10K 85/631; H10K 50/00; H10K 50/10–19;
(Continued)

(56) References Cited

U.S. PATENT DOCUMENTS

| | | |
|---|---|---|
| 2005/0136289 A1 | 6/2005 | Chu et al. |
| 2008/0286610 A1 | 11/2008 | Deaton et al. |

(Continued)

OTHER PUBLICATIONS

International Search Report and Written Opinion issued in PCT/US2019/025523, dated Jun. 24, 2019, 13 pages.
Chen, Yi-Hsiang, et al. "Superior upconversion fluorescence dopants for highly efficient deep-blue electroluminescent devices." Chemical science 7.7 (2016): 4044-4051.
(Continued)

*Primary Examiner* — Younes Boulghassoul
(74) *Attorney, Agent, or Firm* — Meunier Carlin & Curfman LLC

(57) ABSTRACT

Disclosed herein are organic light emitting diode (OLED) devices and methods of use thereof. In one embodiment, an organic light emitting diode (OLED) device includes an emitting layer including: a host and an emitter, wherein the host exhibits triplet-triplet annihilation up-conversion, wherein the emitter has a band gap and exhibits triplet-triplet annihilation up-conversion, wherein the host and the emitter are different, and wherein the emitter has a concentration of 5% or more in the emitting layer.

20 Claims, 10 Drawing Sheets

(51) Int. Cl.
  *H10K 50/11* (2023.01)
  *H10K 50/15* (2023.01)
  *H10K 50/16* (2023.01)
  *H10K 50/17* (2023.01)
  *H10K 101/10* (2023.01)
  *H10K 101/30* (2023.01)
  *H10K 101/60* (2023.01)
  *H10K 102/00* (2023.01)

(52) U.S. Cl.
  CPC .... *H10K 85/631* (2023.02); *C09K 2211/1018* (2013.01); *H10K 50/11* (2023.02); *H10K 50/15* (2023.02); *H10K 50/16* (2023.02); *H10K 50/17* (2023.02); *H10K 50/171* (2023.02); *H10K 2101/10* (2023.02); *H10K 2101/30* (2023.02); *H10K 2101/60* (2023.02); *H10K 2102/351* (2023.02)

(58) Field of Classification Search
  CPC ........ H10K 50/11; H10K 50/15; H10K 50/16; H10K 50/17; H10K 50/171; H10K 2101/00; H10K 2101/10; H10K 2101/30; H10K 2101/60; C09K 11/06; C09K 2211/1018
  See application file for complete search history.

(56) References Cited

U.S. PATENT DOCUMENTS

| | | | | |
|---|---|---|---|---|
| 2011/0233604 | A1* | 9/2011 | Ikeda | H10K 50/125 257/E51.018 |
| 2016/0104847 | A1 | 4/2016 | Xia et al. | |
| 2016/0126463 | A1* | 5/2016 | Kadoma | H10K 85/622 548/445 |
| 2016/0254475 | A1* | 9/2016 | Tsukamoto | H10K 50/165 257/40 |
| 2018/0026207 | A1* | 1/2018 | Takeda | C07D 209/86 548/444 |
| 2020/0168803 | A1* | 5/2020 | Park | H10K 85/615 |

OTHER PUBLICATIONS

Di, Dawei, et al. "Efficient triplet exciton fusion in molecularly doped polymer light-emitting diodes." Advanced Materials 29.13 (2017): 1605987.
Fukagawa, Hirohiko, et al. "Anthracene derivatives as efficient emitting hosts for blue organic light-emitting diodes utilizing triplet-triplet annihilation." Organic Electronics 13.7 (2012): 1197-1203.
Furukawa, Taro, et al. "Dual enhancement of electroluminescence efficiency and operational stability by rapid upconversion of triplet excitons in OLEDs." Scientific reports 5 (2015): 8429.
Jeon, Soon Ok, et al. "External quantum efficiency above 20% in deep blue phosphorescent organic light-emitting diodes." Advanced Materials 23.12 (2011): 1436-1441.
Kondakov, D. Y., et al. "Triplet annihilation exceeding spin statistical limit in highly efficient fluorescent organic light-emitting diodes." Journal of Applied Physics 106.12 (2009): 124510.
Kondakov, Denis Y. "Role of triplet-triplet annihilation in highly efficient fluorescent devices." Journal of The Society for Information Display 17.2 (2009): 137-144.
Lin, Bo-Yen, et al. "Exciplex-Sensitized Triplet-Triplet Annihilation in Heterojunction Organic Thin-Film." ACS Applied Materials & Interfaces 9.12 (2017): 10963-10970.
Luo, Yan-Ju, Zhi-Yun Lu, and Yan Huang. "Triplet fusion delayed fluorescence materials for OLEDs." Chinese Chemical Letters 27.8 (2016): 1223-1230.
Mayr, Christian, Tobias D. Schmidt, and Wolfgang Brütting. "High-efficiency fluorescent organic light-emitting diodes enabled by triplet-triplet annihilation and horizontal emitter orientation." Applied Physics Letters 105.18 (2014), 183304.
Qian, Lei, et al. "Electroluminescence from light-emitting polymer/ZnO nanoparticle heterojunctions at sub-bandgap voltages." Nano Today 5.5 (2010): 384-389.
Suzuki, Tsunenori, et al. "Highly efficient long-life blue fluorescent organic light-emitting diode exhibiting triplet-triplet annihilation effects enhanced by a novel hole-transporting material." Japanese Journal of Applied Physics 53.5 (2014): 052102.
Xiang, Chaoyu, et al. "Origin of Sub-Bandgap Electroluminescence in Organic Light-Emitting Diodes." Small 11.40 (2015): 5439-5443.

* cited by examiner

ORGANIC LIGHT EMITTING DIODE HAVING AN EMITTER LAYER WITH A HOST AND AN EMITTER AND HAVING A TRIPLET INJECTION LAYER COMPRISING THE EMITTER, AND METHODS OF USE THEREOF

CROSS-REFERENCE TO RELATED APPLICATIONS

This application is a national stage application filed under 35 U.S.C. § 371 of PCT/US2019/025523 filed Apr. 3, 2019, which claims the benefit of priority to U.S. Provisional Application No. 62/653,653, filed Apr. 6, 2018, both of which are hereby incorporated herein by reference in their entireties.

BACKGROUND

Organic light emitting diodes (OLEDs) have become quite prevalent in optoelectronic devices. OLED displays currently represent a multi-billion dollar market. The bottleneck for this technology is the lifetime of the blue OLEDs. Current emitters used in OLED technology are phosphorescent with an internal quantum efficiency at almost 100%, but the lifetime for blue OLEDs of this type is very short. Due to the short lifetime of blue phosphorescent OLEDs, some have turned to fluorescent blue OLEDs, which have a better lifetime but suffer from an internal quantum efficiency of 25-35%. A need exists for efficient blue OLEDs with improved lifetime. The devices and methods described herein address these and other needs.

SUMMARY

In accordance with the purposes of the disclosed devices and methods, as embodied and broadly described herein, the disclosed subject matter relates to OLED devices and methods of use thereof.

Additional advantages of the disclosed devices and methods will be set forth in part in the description which follows, and in part will be obvious from the description. The advantages of the disclosed devices and methods will be realized and attained by means of the elements and combinations particularly pointed out in the appended claims. It is to be understood that both the foregoing general description and the following detailed description are exemplary and explanatory only and are not restrictive of the disclosed compositions, as claimed.

The details of one or more embodiments of the invention are set forth in the accompanying drawings and the description below. Other features, objects, and advantages of the invention will be apparent from the description and drawings, and from the claims.

BRIEF DESCRIPTION OF THE FIGURES

The accompanying figures, which are incorporated in and constitute a part of this specification, illustrate several aspects of the disclosure, and together with the description, serve to explain the principles of the disclosure.

DETAILED DESCRIPTION

Figure 1:
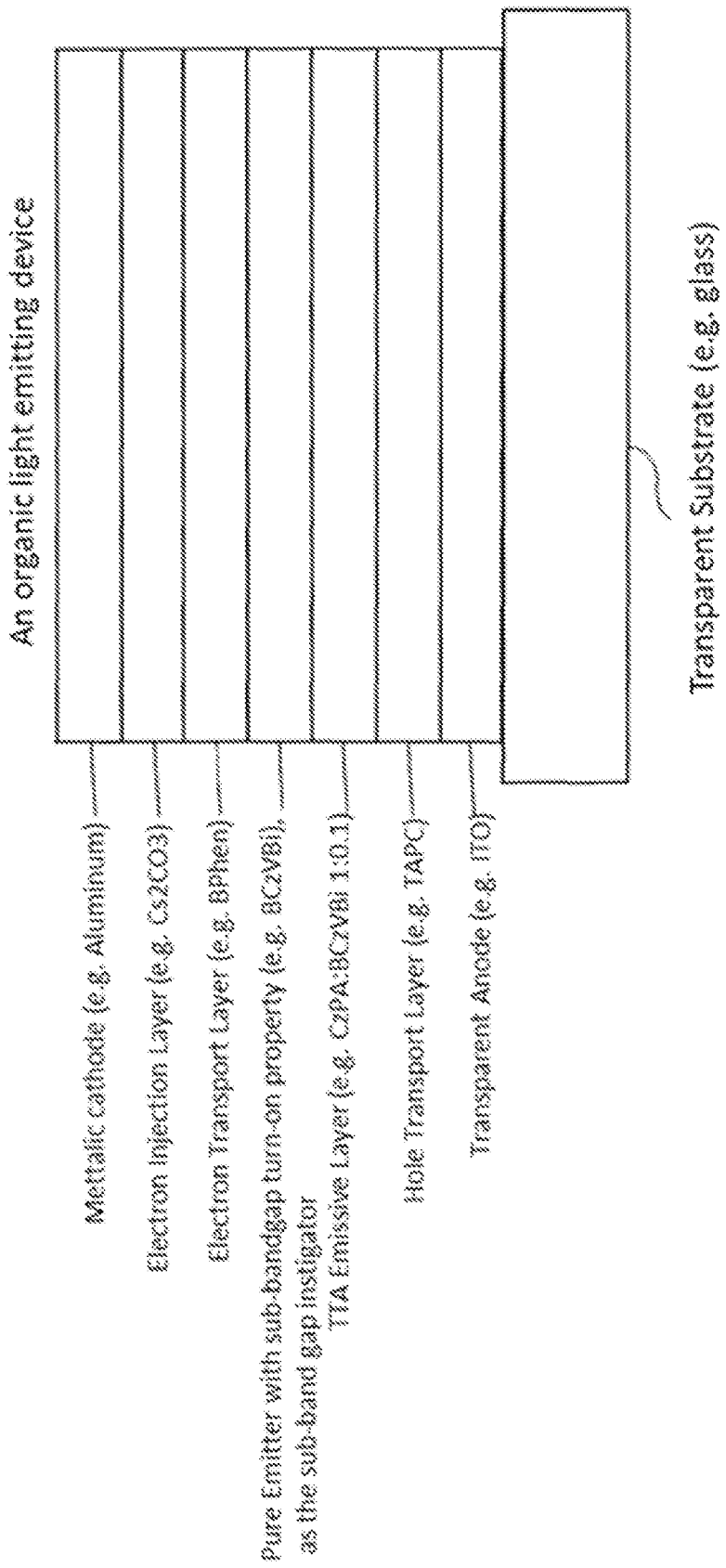
FIG. 1 is an example device comprising an emissive layer (EML) comprising a host (CzPA) and an emitter (BCzVBi), with the emissive layer being positioned between a hole-transport layer (TAPC) and an electron-transport layer (BPhen).

The compositions and methods described herein may be understood more readily by reference to the following detailed description of specific aspects of the disclosed subject matter and the Examples and Figures included therein.

Before the present devices and methods are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings.

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components, and the like.

"Optional" or "optionally" means that the subsequently described event or circumstance can or cannot occur, and that the description includes instances where the event or circumstance occurs and instances where it does not.

Ranges can be expressed herein as from "about" one particular value, and/or to "about" another particular value. By "about" is meant within 5% of the value, e.g., within 4, 3, 2, or 1% of the value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

It is understood that throughout this specification the identifiers "first" and "second" are used solely to aid in distinguishing the various components and steps of the disclosed subject matter. The identifiers "first" and "second" are not intended to imply any particular order, amount, preference, or importance to the components or steps modified by these terms.

Disclosed herein are organic light emitting diode (OLED) devices. The OLED devices comprise a transparent electrode. The transparent electrode comprises a transparent conducting oxide. Examples of transparent conducting oxides include, but are not limited to, indium doped tin oxide (ITO), fluorine doped tin oxide (FTO), aluminum zinc oxide (AZO), and combinations thereof.

The transparent electrode can, for example, have an average thickness of 10 nm or more (e.g., 20 nm or more, 30 nm or more, 40 nm or more, 50 nm or more, 60 nm or more, 70 nm or more, 80 nm or more, 90 nm or more, 100 nm or more, 110 nm or more, 120 nm or more, 130 nm or more, 140 nm or more, 150 nm or more, 160 nm or more, 170 nm or more, or 180 nm or more). In some examples, the transparent electrode can have an average thickness of 200 nm or less (e.g., 190 nm or less, 180 nm or less, 170 nm or less, 160 nm or less, 150 nm or less, 140 nm or less, 130 nm or less, 120 nm or less, 110 nm or less, 100 nm or less, 90 nm or less, 80 nm or less, 70 nm or less, 60 nm or less, 50 nm or less, 40 nm or less, or 30 nm or less). The average thickness of the transparent electrode can range from any of the minimum values described above to any of the maximum values described above. For example, the transparent electrode can have an average thickness of from 10 nm to 200 nm (e.g., from 10 nm to 180 nm, from 10 nm to 160 nm, from 20 nm to 140 nm, from 30 nm to 120 nm, or from 40 nm to 100 nm).

In some examples, the OLED devices can further comprise a hole injection layer, wherein the hole injection layer can be disposed on the transparent electrode. In some examples, the hole injection layers can comprise dipyrazino[2,3-f:2',3'-h]quinoxaline-2,3,6,7,10,11-hexacarbonitrile (HAT-CN); 2,3,5,6-tetrafluoro-7,7,8,8-tetracyano-quinodimethane (F4-TCNQ); pyrazino[2,3-f][1,10]phenanthroline-2,3-dicarbonitrile (PPDN); 2,3,8,9,14,15-Hexafluorodiquinoxalino[2,3-a:2',3'-c]phenazine (HATNA-F6); N1,N1'-(Biphenyl-4,4'-diyl)bis(N1-phenyl-N4,N4-di-m-tolylbenzene-1,4-diamine) (DNTPD); N,N,N',N'-Tetrakis-(4-methoxyphenyl)benzidine (MeO-TPD); 4,4',4"-Tris(N-(naphthalen-2-yl)-N-phenyl-amino)triphenylamine (2T-NATA); 4,4',4"-Tris(N-3-methylphenyl-N-phenyl-amino) triphenylamine (m-MTDATA); 4,4',4"-Tris(N,N-diphenyl-amino)triphenylamine (NATA); 4,4',4"-Tris(N-(naphthalen-1-yl)-N-phenyl-amino)triphenylamine (1T-NATA); 2,7-Bis [N,N-bis(4-methoxy-phenyl)amino]-9,9-spirobifluorene (MeO-Spiro-TPD); 2,2'-Bis[N,N-bis(4-methoxy-phenyl) amino]-9,9-spirobifluorene (2,2'-MeO-Spiro-TPD); N,N'-Diphenyl-N,N'-di-[4-(N,N-di-p-tolyl-amino)phenyl]benzidine (NTNPB); N,N-Diphenyl-N,N'-di-[4-(N,N-diphenyl-amino)phenyl]benzidine (NPNPB); N4,N4'-(Biphenyl-4,4'-diyl)bis(N4,N4',N4'-triphenylbiphenyl-4,4'-diamine) (TPT1); Platinum(II) phthalocyanine (PtPC); Diquinoxalino [2,3-a:2',3'-c]phenazine (HATNA); 2,3,8,9,14,15-Hexachlorodiquinoxalino[2,3-a:2',3'-c]phenazine (HATNA-C16); N2,N2'-(9,9-Dioctyl-9H-fluorene-2,7-diyl)bis(9,9-dim-ethyl-N2,N7,N7-triphenyl-9H-fluorene-2,7-diamine (3FTPD-C8); 2-(2-Methoxyphenyl)-1,3-dimethyl-1H-benzoimidazol-3-ium iodide (MeOPBI); 2,2'-(Naphthalene-2,6-diylidene)dimalononitrile (TNAP); N4,N4'-(Biphenyl-4,4'-diyl)bis(N4'-(naphthalen-1-yl)-N4,N4'-diphenylbiphenyl-4, 4'-diamine) (Di-NPB); N2,N2'-(9,9-Dimethyl-9H-fluorene-2,7-diyl)bis(9,9-dimethyl-N2,N7,N7-triphenyl-9H-fluorene-2,7-diamine) (3DMFL-BPA); N1,N1'-(Biphenyl-4, 4'-diyl)bis(N1-(naphthalen-1-yl)-N4,N4-diphenylbenzene-1,4-diamine) (NPB-DPA); N1,N1'-(biphenyl-4,4'-diyl)bis (N1-(naphthalen-2-yl)-N4,N4-diphenylbenzene-1,4-diamine) (β-NPB-DPA); 7,7,8,8-tetracyano-quinodimethane (TCNQ); derivatives thereof; or combinations of thereof.

The hole injection layer can, for example, have an average thickness of 0.1 nm or more (e.g., 0.5 nm or more, 1 nm or more, 1.5 nm or more, 2 nm or more, 2.5 nm or more, 3 nm or more, 3.5 nm or more, 4 nm or more, 4.5 nm or more, 5 nm or more, 6 nm or more, 7 nm or more, 8 nm or more, 9 nm or more, 10 nm or more, 15 nm or more, 20 nm or more, or 25 nm or more). In some examples, the hole injection layer can have an average thickness of 30 nm or less (e.g., 25 nm or less, 20 nm or less, 15 nm or less, 10 nm or less, 9 nm or less, 8 nm or less, 7 nm or less, 6 nm or less, 5 nm or less, 4.5 nm or less, 4 nm or less, 3.5 nm or less, 3 nm or less, 2.5 nm or less, 2 nm or less, 1.5 nm or less, 1 nm or less, 0.5 nm or less). The average thickness of the hole injection layer can range from any of the minimum values described above to any of the maximum values described above. For example, the hole injection layer can have an average thickness of from 0.1 nm to 30 nm (e.g., from 0.1 nm to 25 nm, from 0.1 nm to 20 nm, from 0.5 nm to 15 nm, or from 1 nm to 10 nm).

The OLED devices further comprise a hole transport layer. If the hole injection layer is present, the hole injection layer is in contact with the transparent electrode and the hole transport layer such that the hole injection layer is disposed between the transparent electrode and the hole transport layer. If the hole injection layer is absent, the hole transport layer is disposed on the transparent electrode.

In some examples, the hole transport layer can comprise 4,4'-Cyclohexylidenebis[N,N-bis(4-methylphenyl)benzenamine] (TAPC); N,N'-Bis(naphthalen-1-yl)-N,N'-bis(phenyl)-benzidine (NPB); N4,N4,N4',N4'-tetra([1,1'-biphenyl]-4-yl)-[1,1'-biphenyl]-4,4'-diamine; N4,N4-di(biphenyl-4-yl)-N4'-(naphthalen-1-yl)-N4'-phenyl-biphenyl-4,4'-diamine; 2,2'-Dimethyl-N4,N4,N4',N4'-tetramtolylbiphenyl-4,4'-diamine (2,2'-HMTPD); 6,6'-(9',9'-Bis(6-((3-ethyloxetan-3-yl)methoxy)hexyl)-7,7'-diphenyl-9H,9'H-2,2'-bifluorene-9,9-diyl)bis(N,Ndiethylhexan-1-amine) (PFN-OX); N4,N4'-Bis(4-(6-((3-ethyloxetan-3-yl)methoxy) hexyl)phenyl)-N4,N4'-diphenylbiphenyl-4,4'-diamine (OTPD); N4,N4'-Di(naphthalen-1-yl)-N4,N4'-bis(4-vinylphenyl)biphenyl-4,4'-diamine (VNPB); N,N,N',N'-Tetra-(3-methylphenyl)-3,3'-dimethylbenzidine (HMTPD); 2,2',7,7'-Tetra(N,N-di-p-tolyl)amino-9,9-spirobifluorene (Spiro-TTB); N4,N4'-Bis(9,9-dimethyl-9H-fluoren-2-yl)-N4,N4'-diphenylbiphenyl-4,4'-diamine (BF-DPB); 2,2',7,7'-Tetrakis [N-naphthalenyl(phenyl)-amino]-9,9-spirobifluorene (Spiro-2NPB); 2,2',7,7'-Tetrakis(N,N-diphenylamino)-2,7-diamino-9,9-spirobifluorene (Spiro-TAD); N,N'-Bis(naphthalen-1-yl)-N,N'-bis(phenyl)-2,2'-dimethylbenzidine (α-NPD); N,N'-Bis(naphthalen-1-yl)-N,N'-bis(phenyl)-2,7-diamino-9,9-dimethylfluorene (DMFL-NPB); N,N'-Bis (naphthalen-1-yl)-N,N'-bis(phenyl)-2,7-diamino-9,9-spirobifluorene (Spiro-NPB); N,N'-Bis(3-methylphenyl)-N,N'-bis(phenyl)-benzidine (TPD); N,N'-Bis(naphthalen-2-yl)-N, N'-bis(phenyl)-benzidine (β-NPB); N,N'-Bis(3-methylphenyl)-N,N'-bis(phenyl)-2,7-diamino-9,9-dimethylfluorene (DMFL-TPD); N,N'-Bis(3-methylphenyl)-N,N'-bis(phenyl)-2,7-diamino-9,9-diphenylfluorene (DPFL-TPD); N,N'-Bis(naphthalen-1-yl)-N,N'-bis(phenyl)-2,7-diamino-9,9-diphenylfluorene (DPFL-NPB); 9,9-Bis[4-(N,N-bis-naphthalen-2-yl-amino)phenyl]-9H-fluorene (NPAPF); 9,9-Bis[4-(N-naphthalen-1-yl-N-phenylamino)-phenyl]-9H-fluorene (NPBAPF); N,N'-Bis (phenanthren-9-yl)-N,N'-bis(phenyl)-benzidine (PAPB); N,N,N',N'-Tetra-naphthalen-2-yl-benzidine (β-TNB); N,N'-Di(naphthalenyl)-N,N'-di(naphthalen-2-yl)-benzidine (α,β-TNB); N,N,N',N'-Tetra-naphthalenyl-benzidine (α-TNB); N,N'-Di(naphthalen-2-yl)-N,N'-diphenylbenzene-1,4-diamine (β-NPP); $N^1,N^4$-Diphenyl-$N^1,N^4$-di-m-tolylbenzene-1,4-diamine (TTP); $N^2,N^2,N^6,N^6$-Tetraphenylnaphthalene-2,6-diamine (NDDP); Tris(4-(quinolin-8-yl)phenyl)amine (TQTPA); N4,N4'-Di(biphenyl-4-yl)-N4,N4'-diphenylbiphenyl-4,4'-diamine (TPD10); N2,N7-Di(naphthalen-1-yl)-9,9-dioctyl-N2,N7-diphenyl-9H-fluorene-2,7-Diamine (DOFL-NPB); N,N'-Bis(3-methylphenyl)-N,N'-bis(phenyl)-9,9-dioctyl-fluorene (DOFL-TPD); N4,N4'-Di(naphthalen-1-yl)-N4,N4'-bis(4-vinylphenyl)biphenyl-4,4'-diamine (NVPB); N4,N4'-Di(naphthalen-1-yl)-N4-(4-octylphenyl)-N4'-phenylbiphenyl-4,4'-Diamine (ONPB); N4,N4'-N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD); 4,4'-(Diphenylmethylene)bis(N,N-diphenylaniline) (TCBPA); N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC); Tris (phenylpyrazole)iridium (Ir(ppz)3); Tri(biphenyl-4-yl) amine (TBA); 2,2',7,7'-Octa(m-tolylamine)-9,9-spirobifluorene (Spiro-mTTB); Poly(9,9-bis(6-trimethyl ammoniumiodide)-hexylfluorene-2,7-diyl-alt(benzo[2,1,3] thiadiazol-4,7-diyl)) (PFNIBT); 4,4'-(Diphenylsilanediyl) bis(N,N-diphenylaniline) (TSBPA); 4,4'-(9H-fluoren-9-ylidene)bis[N,N-bis(4-methylphenyl)-benzenamine (BTAF); 9,10-Dihydro-9,9-dimethyl-10-(9-phenyl-9H-carbazol-3-yl)-acridine (PCZAC); derivatives thereof; or combinations thereof.

The hole transport layer can, for example, have an average thickness of 10 nm or more (e.g., 20 nm or more, 30 nm or more, 40 nm or more, 50 nm or more, 60 nm or more, 70 nm or more, 80 nm or more, 90 nm or more, 100 nm or more, 110 nm or more, 120 nm or more, 130 nm or more, 140 nm or more, 150 nm or more, 160 nm or more, 170 nm or more, or 180 nm or more). In some examples, the hole transport layer can have an average thickness of 200 nm or less (e.g., 190 nm or less, 180 nm or less, 170 nm or less, 160 nm or less, 150 nm or less, 140 nm or less, 130 nm or less, 120 nm or less, 110 nm or less, 100 nm or less, 90 nm or less, 80 nm or less, 70 nm or less, 60 nm or less, 50 nm or less, 40 nm or less, or 30 nm or less). The average thickness of the hole transport layer can range from any of the minimum values described above to any of the maximum values described above. For example, the hole transport layer can have an average thickness of from 10 nm to 200 nm (e.g., from 10 nm to 180 nm, from 20 nm to 160 nm, from 30 nm to 140 nm, from 40 nm to 120 nm, or from 50 nm to 100 nm).

The OLED devices further comprise an emitting layer. If the hole injection layer is present, the hole transport layer is in contact with the hole injection layer and the emitting layer such that the hole transport layer is disposed between the hole injection layer and the emitting layer. If the hole injection layer is absent, the hole transport layer is in contact with the transparent electrode and the emitting layer such that the hole transport layer is disposed between the transparent electrode and the emitting layer.

The emitting layer comprises a host and an emitter, wherein: the host exhibits triplet-triplet annihilation up-conversion, the emitter has a band gap and exhibits triplet-triplet annihilation up-conversion, and the host and the emitter are different. In some examples, the host and the emitter each exhibit sub-bandgap electroluminescence.

In some examples, the host has a singlet energy ($S_1$) and the emitter has a singlet energy, wherein the singlet energy of the host is larger than that of the emitter molecule so there can be Forster energy transfer from the host to the emitter. The host, for example, has a triplet energy and the emitter has a triplet energy ($T_1$), wherein the triplet energy ($T_1$) of the emitter is greater than or equal to that of the host. In some examples, the hole transport layer has a singlet energy and a triplet energy that are each greater than the singlet energy and the triplet energy of both the host and the emitter, respectively.

The host can have a higher concentration in the emitting layer than the emitter. The emitter can have a concentration of 5% or more in the emitting layer. In some examples, the concentration of the emitter in the emitting layer is 5% or more (e.g., 6% or more, 7% or more, 8% or more, 9% or more, 10% or more, 11% or more, 12% or more, 13% or more, 14% or more, 15% or more, 16% or more, 17% or more, or 18% or more). In some examples, the concentration of the emitter in the emitting layer is 20% or less (e.g., 19% or less, 18% or less, 17% or less, 16% or less, 15% or less, 14% or less, 13% or less, 12% or less, 11% or less, 10% or less, 9% or less, 8% or less, or 7% or less). The concentration of the emitter in the emitting layer can range from any of the minimum values described above to any of the maximum values described above. For example, the concentration of the emitter in the emitting layer can be from 5% to 20% (e.g., from 6% to 19%, from 7% to 18%, from 8% to 17%, from 9% to 16%, or from 10% to 15%).

The host can, for example, comprise anthracene, 9,10-diphenylanthracene (DPA), 9-(4-(10-phenylanthracen-9-yl)phenyl)-9H-carbazole (CzPA); 1,1'-(2,5-Dimethyl-1,4-phenylene)dipyrene (DMPPP); derivatives thereof, or combinations thereof. In some examples, the host can comprise 9-(4-(10-phenylanthracen-9-yl)phenyl)-9H-carbazole (CzPA) or a derivative thereof. In some examples, the emitter can comprise 4,4'-Bis[4-(diphenylamino)styryl]biphenyl (BDAVBi); 4,4-bis[4-(di-p-tolylamino)styryl]biphenyl (DPAVBi); 1,4-bis(4-9H-carbazol-9-yl)styryl)benzene (BCzSB); 1,4-Di-[4-(N,N-diphenyl)amino]styryl-benzene (DSA-Ph); 4,4'-bis(4-(9H-carbazol-9-yl)styryl)biphenyl (BSB4); 4,4'-Bis(9-ethyl-3-carbazovinylene)-1,1'-biphenyl (BCzVBi); derivatives thereof; or combinations thereof. In certain examples, the emitter comprises BCzVBi or a derivative thereof and the host comprises CzPA or a derivative thereof. The emitter, in some examples, consists of BCzVBi or a derivative thereof and the host, in some examples, consists of CzPA or a derivative thereof. The emitting layer can, for example, consist of the emitter and the host.

The emitting layer can, for example, have an average thickness of 5 nm or more (e.g., 10 nm or more, 15 nm or more, 20 nm or more, 25 nm or more, 30 nm or more, 35 nm or more, 40 nm or more, or 45 nm or more). In some examples, the emitting layer can have an average thickness of 50 nm or less (e.g., 45 nm or less, 40 nm or less, 35 nm or less, 30 nm or less, 25 nm or less, 20 nm or less, 15 nm or less, or 10 nm or less). The average thickness of the emitting layer can range from any of the minimum values described above to any of the maximum values described above. For example, the emitting layer can have an average thickness of from 5 nm to 50 nm (e.g., from 10 nm to 50 nm, from 15 nm to 45 nm, or from 20 nm to 40 nm).

The OLED devices further comprise a triplet injection layer comprising the emitter, wherein the emitting layer is in contact with the hole transport layer and the triplet injection layer such that the emitting layer is disposed between the hole transport layer and the triplet injection layer. In some examples, the triplet injection layer consists of the emitter. The triplet injection layer can, for example, have an average thickness of 1 nm or more (e.g., 2 nm or more, 3 nm or more, 4 nm or more, 5 nm or more, 6 nm or more, 7 nm or more, 8 nm or more, or 9 nm or more). In some examples, the triplet injection layer can have an average thickness of 10 nm or less (e.g., 9 nm or less, 8 nm or less, 7 nm or less, 6 nm or less, 5 nm or less, 4 nm or less, 3 nm or less, or 2 nm or less). The average thickness of the triplet injection layer can range from any of the minimum values described above to any of the maximum values described above. For example, the triplet injection layer can have an average thickness of from 1 nm to 10 nm (e.g., from 1 nm to 9 nm, from 1 nm to 8 nm, from 1 nm to 7 nm, from 1 nm to 6 nm, or from 1 nm to 5 nm).

The OLED devices further comprise an electron transport layer, wherein the triplet injection layer is in contact with the emitting layer and the electron transport layer such that the triplet injection layer is disposed between the emitting layer and the electron transport layer. The electron transport layer can, for example, have a singlet energy and a triplet energy that are each greater than the singlet energy and the triplet energy of both the host and emitter, respectively.

In some examples, the electron transport layer can comprise 2,4,6-Tris(3-(pyrimidin-5-yl)phenyl)-1,3,5-triazine (TPM-TAZ); 8-Hydroxyquinolinolato-lithium (Liq); 1,3,5-Tris(1-phenyl-1H-benzimidazol-2-yl)benzene (TPBi); Bis(2-methyl-8-quinolinolate)-4-(phenylphenolato)aluminum (BAlq); 1,3-Bis[2-(2,2'-bipyridine-6-yl)-1,3,4-oxadiazo-5-yl]benzene (Bpy-OXD); 6,6'-Bis[5-(biphenyl-4-yl)-1,3,4-oxadiazo-2-yl]-2,2'-bipyridyl (BP-OXD-Bpy); 3-(4-Biphenyl)-4-phenyl-5-tert-butylphenyl-1,2,4-triazole (TAZ); 4-(Naphthalen-1-yl)-3,5-diphenyl-4H-1,2,4-triazole (NTAZ); 2,9-Bis(naphthalen-2-yl)-4,7-diphenyl-1,10-phenanthroline (NBPhen); 2,7-Bis[2-(2,2'-bipyridine-6-yl)-1,3,4-oxadiazo-5-yl]-9,9-dimethylfluorene (Bpy-FOXD); 1-Methyl-2-(4-(naphthalen-2-yl)phenyl)-1H-imidazo[4,5f][1,10]phenanthroline (2-NPIP); 2-(Naphthalen-2-yl)-4,7-diphenyl-1,10-phenanthroline (HNBphen); Phenyl-dipyrenylphosphine oxide (POPy2); 4,4'-Bis(4,6-diphenyl-1,3,5-triazin-2-yl)biphenyl (BTB); 1,3-Bis[3,5-di(pyridin-3-yl)phenyl]benzene (BmPyPhB); 2-(4-(9,10-Di(naphthalen-2-yl)anthracen-2-yl)phenyl)-1-phenyl-1H-phenanthro[9,10-d]imidazole (Bepq2); Diphenylbis(4-(pyridin-3-yl)phenyl)silane (DPPS); 3,5-Di(pyren-1-yl)pyridine (PY1); 1,3,5-Tri(p-pyrid-3-yl-phenyl)benzene (TpPyPB); 2,4,6-Tris(3'-(pyridin-3-yl)biphenyl-3-yl)-1,3,5-triazine (TmPPPyTz); 4,6-Bis(3,5-di(pyridin-3-yl)phenyl)-2-methylpyrimidine (B3PYMPM); 1,3,5-Tris(4-(pyridin-4-yl)quinolin-2-yl)benzene (TPyQB); 4,6-Bis(3,5-di(pyridin-4-yl)phenyl)-2-methylpyrimidine (B4PYMPM); 2,7-Di(2,2'-bipyridin-5-yl)triphenylene (BPy-TP2); 2,2'-(4,4'-(Phenylphosphoryl)bis(4,1-phenylene))bis(1-phenyl-1H-benzo[d]imidazole) (BIPO); Lithium 2-(2',2''-bipyridine-6'-yl)phenolate (Libpp); 4,6-Bis(3,5-di(pyridin-4-yl)phenyl)-2-phenylpyrimidine; (B4PYPPM); 1,3,5-Tris(6-(3-(pyridin-3-yl)phenyl)pyridin-2-yl)benzene (Tm3PyP2PyB); 4,6-Bis(3,5-di(pyridin-3-yl)phenyl)-2-(pyridin-3-yl)pyrimidine (B3PYPPM); 4,6-Bis(3,5-di(pyridin-4-yl)phenyl)-2-(3-(pyridin-3-yl)phenyl) pyrimidine (B4PYPPyPM); 1,3,5-Tri(diphenylphosphoryl-phen-3-yl) benzene (TP3PO); Poly[9,9-bis[6'-(N,N,N-trimethylammonium)hexyl]fluorene-alt-co-1,4-phenylene] bromide (FPQ-Br); 8-Hydroxyquinoline sodium salt (NaQ); 4,7-Diphenyl-2-(4-(1-phenyl-1H-benzo[d]imidazol-2-yl)phenyl)-1,10-Phenanthroline (BimiBphen); 4,7-Diphenyl-2,9-bis(4-(1-phenyl-1H-benzo[d]imidazol-2-yl)phenyl)-1,10-Phenanthroline (DBimiBphen); 2,4,6-Tris[3-(diphenylphosphinyl)phenyl]-1,3,5-triazine (POT2T); 2,4,6-tris(biphenyl-3-yl)-1,3,5-triazine (T2T); bathophenanthroline (BPhen); Tris(8-hydroxy-quinolinato) aluminum (Alq3); tris(2,4,6-trimethyl-3-(pyridine-3-yl)phenyl)borane (3TPYMB); derivatives thereof, or combinations thereof. In some examples, the electron transport layer can comprise bathophenanthroline (BPhen); 2,9-Bis(naphthalen-2-yl)-4,7-diphenyl-1,10-phenanthroline (NBPhen); 4,6-Bis(3,5-di(pyridin-3-yl)phenyl)-2-methylpyrimidine (B3PYMPM); 4,6-Bis(3,5-di(pyridin-4-yl)phenyl)-2-methylpyrimidine (B4PYMPM); 1,3,5-Tris(1-phenyl-1Hbenzimidazol-2-yl)benzene (TPBi); Tris(8-hydroxy-quinolinato)

aluminum (Alq3); 2,4,6-Tris[3-(diphenylphosphinyl)phenyl]-1,3,5-triazine (POT2T); 2,4,6-tris(biphenyl-3-yl)-1,3,5-triazine (T2T); 1,3,5-Tri(p-pyrid-3-yl-phenyl)benzene (TpPyPB); tris(2,4,6-trimethyl-3-(pyridine-3-yephenyl)borane (3TPYMB); derivatives thereof; or combination thereof.

The electron transport layer can, for example, have an average thickness of 5 nm or more (e.g., 10 nm or more, 15 nm or more, 20 nm or more, 25 nm or more, 30 nm or more, 35 nm or more, 40 nm or more, 45 nm or more, 50 nm or more, 60 nm or more, 70 nm or more, or 80 nm or more). In some examples, the electron transport layer can have an average thickness of 100 nm or less (e.g., 90 nm or less, 80 nm or less, 70 nm or less, 60 nm or less, 50 nm or less, 45 nm or less, 40 nm or less, 35 nm or less, 30 nm or less, 25 nm or less, 20 nm or less, or 15 nm or less). The average thickness of the electron transport layer can range from any of the minimum values described above to any of the maximum values described above. For example, the electron transport layer can have an average thickness of from 5 nm to 100 nm (e.g., from 5 nm to 90 nm, from 5 nm to 80 nm, from 10 nm to 70 nm, from 15 nm to 60 nm, or from 20 nm to 50 nm).

In some example, the OLED devices can further comprise an electron injection layer, wherein the electron transport layer is in contact with the triplet injection layer and the electron injection layer, such that the electron transport layer is disposed between the triplet injection layer and the electron injection layer. The electron injection layer can, for example, comprise $Cs_2CO_3$, $Rb_2CO_3$, $ReO_3$, derivatives thereof, or combinations thereof.

The electron injection layer can, for example, have an average thickness of 0.1 nm or more (e.g., 0.5 nm or more, 1 nm or more, 1.5 nm or more, 2 nm or more, 2.5 nm or more, 3 nm or more, 3.5 nm or more, 4 nm or more, 4.5 nm or more, 5 nm or more, 6 nm or more, 7 nm or more, 8 nm or more, 9 nm or more, 10 nm or more, 15 nm or more, 20 nm or more, or 25 nm or more). In some examples, the electron injection layer can have an average thickness of 30 nm or less (e.g., 25 nm or less, 20 nm or less, 15 nm or less, 10 nm or less, 9 nm or less, 8 nm or less, 7 nm or less, 6 nm or less, 5 nm or less, 4.5 nm or less, 4 nm or less, 3.5 nm or less, 3 nm or less, 2.5 nm or less, 2 nm or less, 1.5 nm or less, 1 nm or less, 0.5 nm or less). The average thickness of the electron injection layer can range from any of the minimum values described above to any of the maximum values described above. For example, the electron injection layer can have an average thickness of from 0.1 nm to 30 nm (e.g., from 0.1 nm to 25 nm, from 0.1 nm to 20 nm, from 0.5 nm to 15 nm, or from 1 nm to 10 nm).

The OLED devices further comprise a cathode. If the electron injection layer is present, the electron injection layer is in contact with the electron transport layer and the cathode such that the electron injection layer is disposed between the electron transport layer and the cathode. If the electron injection layer is absent, the electron transport layer is in contact with the triplet injection layer and the cathode such that the electron transport layer is disposed between the triplet injection layer and the cathode. The cathode can, for example, comprise a metal. In some examples, the cathode can comprise Cu, Ag, Au, Fe, Al, Pt, Mg, or a combination thereof.

The cathode can, for example, have an average thickness of 10 nm or more (e.g., 20 nm or more, 30 nm or more, 40 nm or more, 50 nm or more, 60 nm or more, 70 nm or more, 80 nm or more, or 90 nm or more). In some examples, the cathode can have an average thickness of 100 nm or less (e.g., 90 nm or less, 80 nm or less, 70 nm or less, 60 nm or less, 50 nm or less, 40 nm or less, 30 nm or less, or 20 nm or less). The average thickness of the cathode can range from any of the minimum values described above to any of the maximum values described above. For example, the cathode can have an average thickness of from 10 nm to 100 nm (e.g., from 20 nm to 100 nm, from 30 nm to 100 nm, from 40 nm to 100 nm, from 50 nm to 100 nm, from 60 nm to 100 nm, or from 70 nm to 100 nm).

The OLED devices can, for example, emit light upon application of a voltage. In some examples, the applied voltage can be less than the bandgap of the emitter. In some examples, the OLED device emits blue light. The OLED device can, in certain examples, emit blue light via blue electroluminescence. In some examples, the OLED device can emit blue light via electroluminescence and has an operating voltage of 4 V or less at 1000 $cd/m^2$.

Also disclosed herein are methods of use of the OLED devices described herein. For example, the methods can comprise applying a voltage to the OLED device such that the OLED device emits light. In some examples, the applied voltage is less than the bandgap of the emitter. The light emitted by the OLED device can, for example, comprise blue light. In some examples, the OLED device can emit blue light via blue electroluminescence. In some examples, wherein the OLED device emits blue light via electroluminescence and has an operating voltage of 4 V or less at 1000 $cd/m^2$.

In some examples, the OLED devices described herein can be used in various articles of manufacture. Examples of articles of manufacture (e.g., devices) using the electrochromic devices described herein can include, but are not limited to, electronic displays (e.g., televisions, smart phones, smart watches, lights). Such articles of manufacture can be fabricated by methods known in the art.

A number of embodiments of the invention have been described. Nevertheless, it will be understood that various modifications may be made without departing from the spirit and scope of the invention. Accordingly, other embodiments are within the scope of the following claims.

The examples below are intended to further illustrate certain aspects of the systems and methods described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of measurement conditions, e.g., component concentrations, temperatures, pressures and other measurement ranges and conditions that can be used to optimize the described process.

Example 1

OLEDs make use of a thin organic film placed between two conductive electrodes of which at least one is transparent. The thin organic film usually comprises three layers, an electron transporting layer (ETL), an emissive layer (EML) and a hole transporting layer (HTL). The emissive layer is usually made of two organic materials, a host and an emitter. Depending on the emission mechanism of the emitter, OLEDs are categorized in three main categories:
1. Fluorescent OLEDs, where the emitter's excited triplet state ($T_1$) is non-radiative and the emitter's excited singlet state ($S_1$) is radiative.
2. Phosphorescent OLEDs, where the emitter's $T_1$ is radiative, but the triplet-singlet energy splitting ($\Delta E_{ST}$) is larger than 40 meV.
3. Thermally activated delayed fluorescent (TADF) OLEDs, where emitter's $S_1$ is radiative however $\Delta E_{ST}$ is smaller than 40 meV.

In both TADF and Phosphorescent OLEDs the $T_1$ of the emitter must be equal or larger than the photon energy of the emitted light. This in turn, leads to high energy $T_1$ states for blue TADF and Phosphorescent OLEDs. The high energy $T_1$ states then annihilate with other states and excite even higher energy states with energies higher than the dissociation energy of the organic bonds and destroy the organic molecule. Therefore, the operational lifetime of blue phosphorescent and TADF OLEDs have struggled in comparison with Fluorescent OLEDs. Although the fluorescent blue OLEDs achieve long operational lifetimes, their external quantum efficiency (EQE) and power efficiency is relatively low.

The turn-on voltage in traditional OLED devices is typically equal or greater than the bandgap energy of the emitting molecule or the photon energy of the emitted light. Reducing the turn-on voltage can lead to an increase in power-efficiency of the OLED device, furthermore a reduced turn-on voltage can increase the operational lifetime of the device, due to the reduced electrical stress.

Sub-bandgap electroluminescence in OLEDs can be achieved by utilizing triplet-triplet annihilation up-conversion (TTA-UC), where two triplet states annihilate to create one singlet state with higher energy. To date, it has been argued that to achieve sub-bandgap electroluminescence, a charge-transfer (CT) or an exciplex state is required to transfer energy to the triplet state of the annihilating molecule. Further, the previously reported OLED devices showing sub-bandgap electroluminescence show poor efficiencies that makes them impractical. The low efficiency is a result of the quenching nature of the CT state or the exciplex state. Herein, an efficient OLED device with sub-bandgap electroluminescence is described, without using an exciplex or CT state.

Described herein are organic light emitting devices (OLEDs); more specifically, low voltage blue fluorescent organic light emitting diodes. The devices comprise an emissive layer including a host and an emitter, each showing triplet-triplet annihilation up-conversion (TTA-UC) such that efficient sub-bandgap electroluminescence can be achieved. The efficient sub-bandgap electroluminescence can be used to increase: external quantum efficiency, current efficiency, power efficiency and operational lifetime of blue OLEDs. In some examples, the OLEDs described herein can exhibit emission at 420 nm (2.9 eV) by applying a voltage of only 2.4 volts (e.g., sub-bandgap).

In some examples, the emissive layer of the devices described herein can comprise a host and an emitter. The host can have a higher concentration in the emissive layer than the emitter. Both the host and the emitter show triplet-triplet annihilation. The singlet energy ($S_1$) of the host is larger than that of the emitter so there can be Forster energy transfer from the host to the emitter. The triplet energy ($T_1$) of the emitter is greater than or equal to that of the host. The emissive layer is placed between a hole-transport layer (HTL) and an electron-transport layer (ETL). The ETL and HTL each comprise a material that has a $S_1$ and a $T_1$ larger than that of the host and emitter, respectively.

In some examples, the emitter comprises BCzVBi:

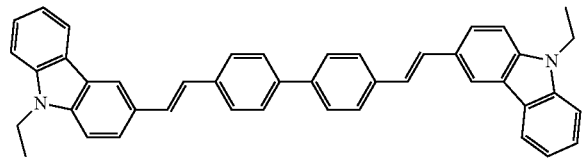 [SMILES: CCn1c2ccccc2c2cc(/C=C/c3ccc(-c4ccc(/C=C/c5ccc6c(c5)c5ccccc5n6CC)cc4)cc3)ccc21]

In some examples, the host is selected from the group consisting of:

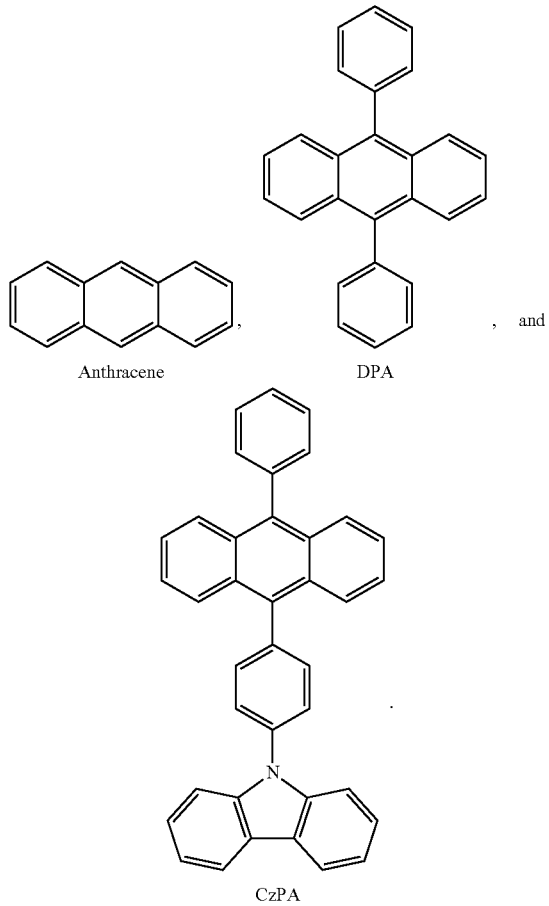

Anthracene, DPA, and

CzPA

In some examples, the ETL material and the HTL material can be selected from the group consisting of:

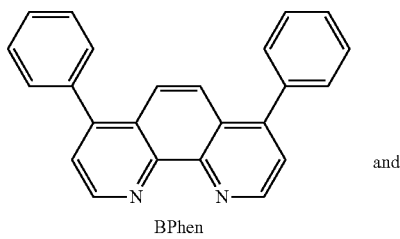

BPhen and

-continued

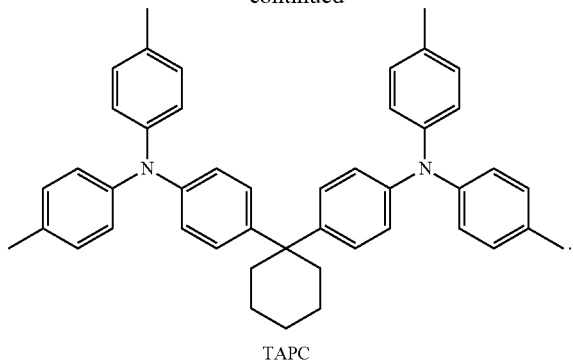

TAPC

In some examples, the device further comprises a layer consisting of the emitter. The devices can exhibit sub-bandgap turn on voltage.

An example device is shown in FIG. 1. In FIG. 1 the emissive layer (EML) comprises a host (CzPA) and an emitter (BCzVBi), with an unusually large concentration of the emitter (e.g. 10:1 ratio). The emissive layer is positioned between a hole-transport layer (TAPC) and an electron-transport layer (BPhen).

Figure 2:
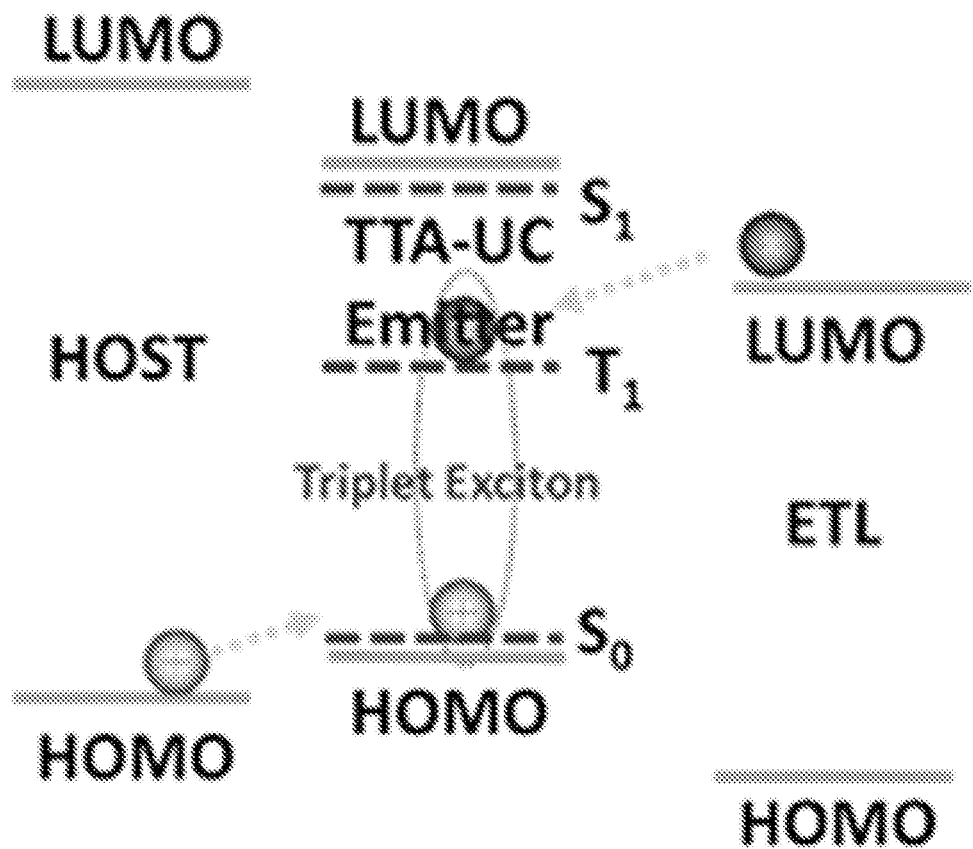
FIG. 2 is a schematic diagram of the mechanism for the sub-bandgap electroluminescence in the emissive layer.

In FIG. 2, the thin layer of the emitter between the emissive layer and the electron transport layer works as a starter for the sub-bandgap electroluminescence, with the mechanism displayed schematically.

Example 2

Figure 3:
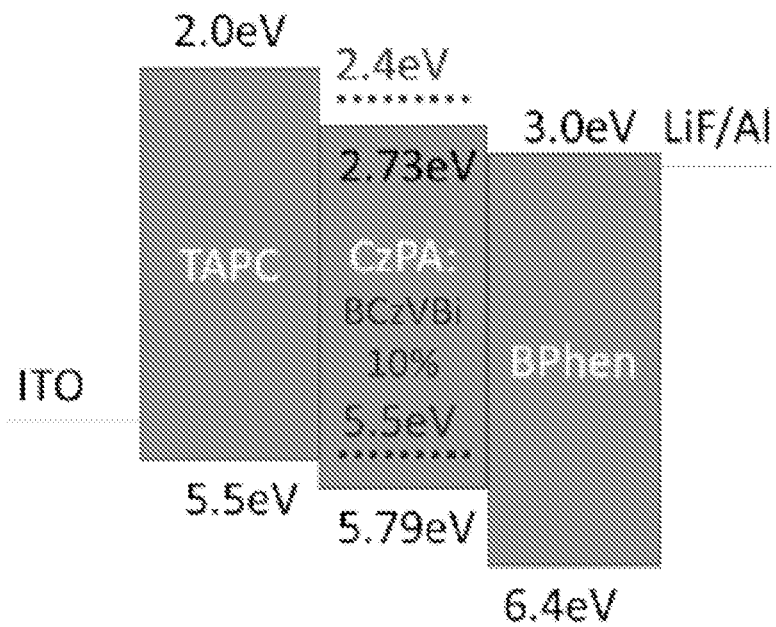
FIG. 3 is a schematic diagram of an example OLED device comprising a transparent electrode (ITO), a hole transport layer comprising TAPC disposed on the transparent electrode, an emissive layer comprising a host (CzPA) and an emitter (BCzVBi) disposed on the hole transport layer, an electron transport layer comprising BPhen disposed on the emissive layer, and a cathode comprising LiF/Al disposed on the electron transport layer.

An example OLED device as described herein was fabricated using a transparent electrode (ITO), a hole transport layer comprising TAPC disposed on the transparent electrode, an emissive layer comprising a host (CzPA) and an emitter (BCzVBi) disposed on the hole transport layer, an electron transport layer comprising BPhen disposed on the emissive layer, and a cathode comprising LiF/Al disposed on the electron transport layer. The energy levels of the various layers of this device are shown schematically in FIG. 3.

Figure 4:
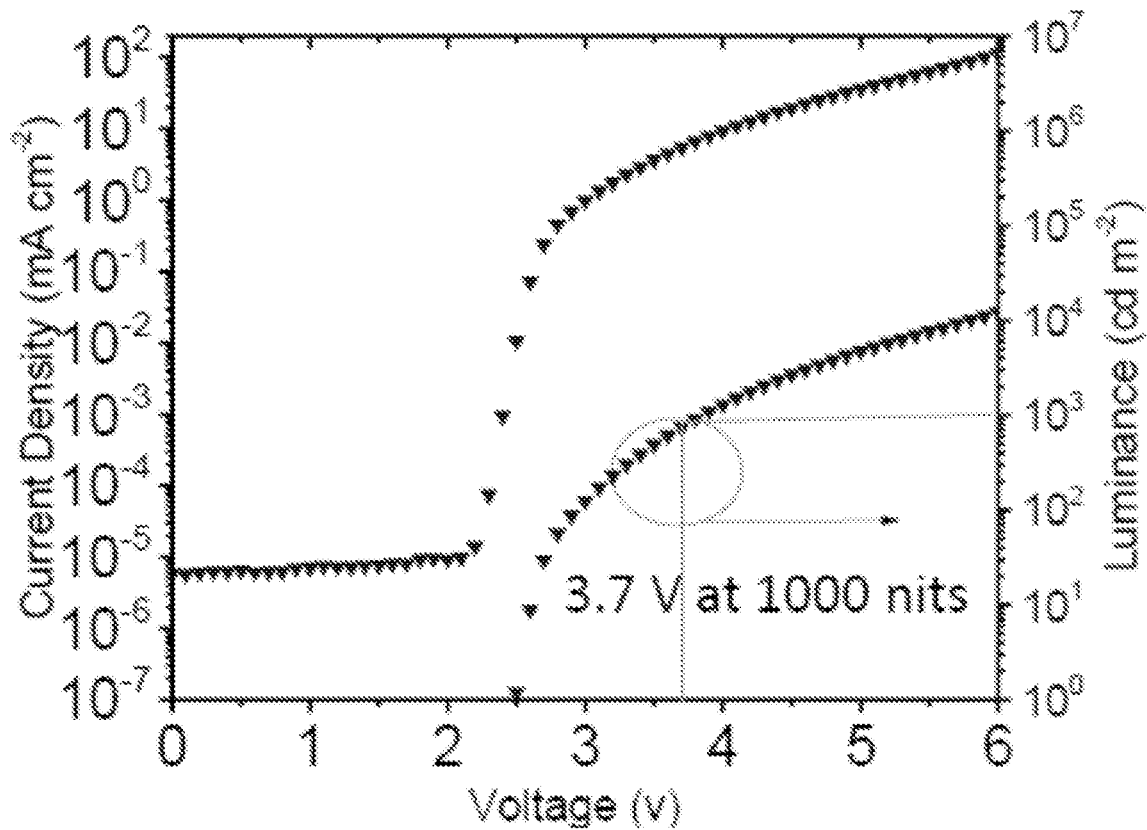
FIG. 4 shows the current density (left axis, upper trace) and luminance (right axis, lower trace) of the device of FIG. 3 against various applied voltages.
Figure 5:
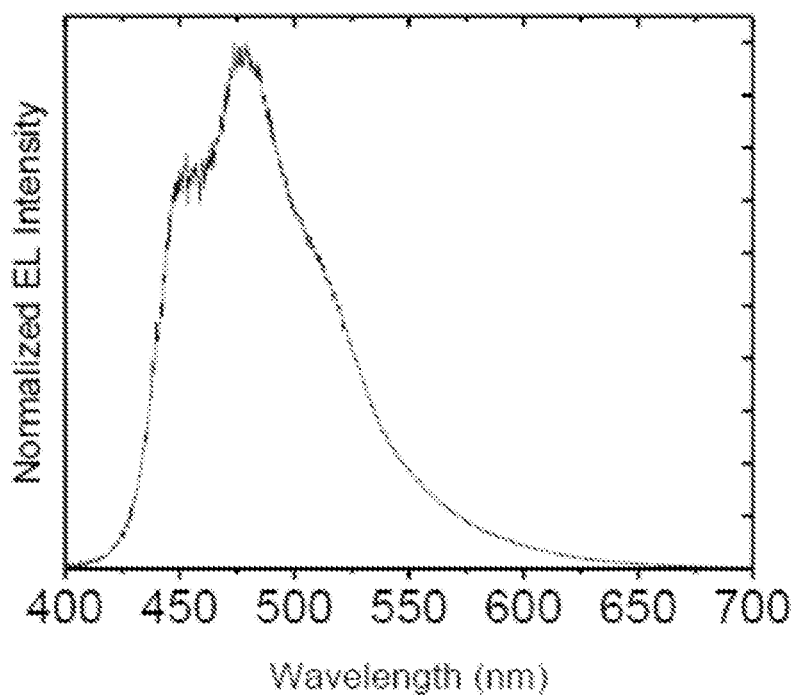
FIG. 5 shows the normalized electroluminescence intensity of the device of FIG. 3, showing that the device emits at wavelengths between about 450 and 500 nm, e.g., blue light.
Figure 6:
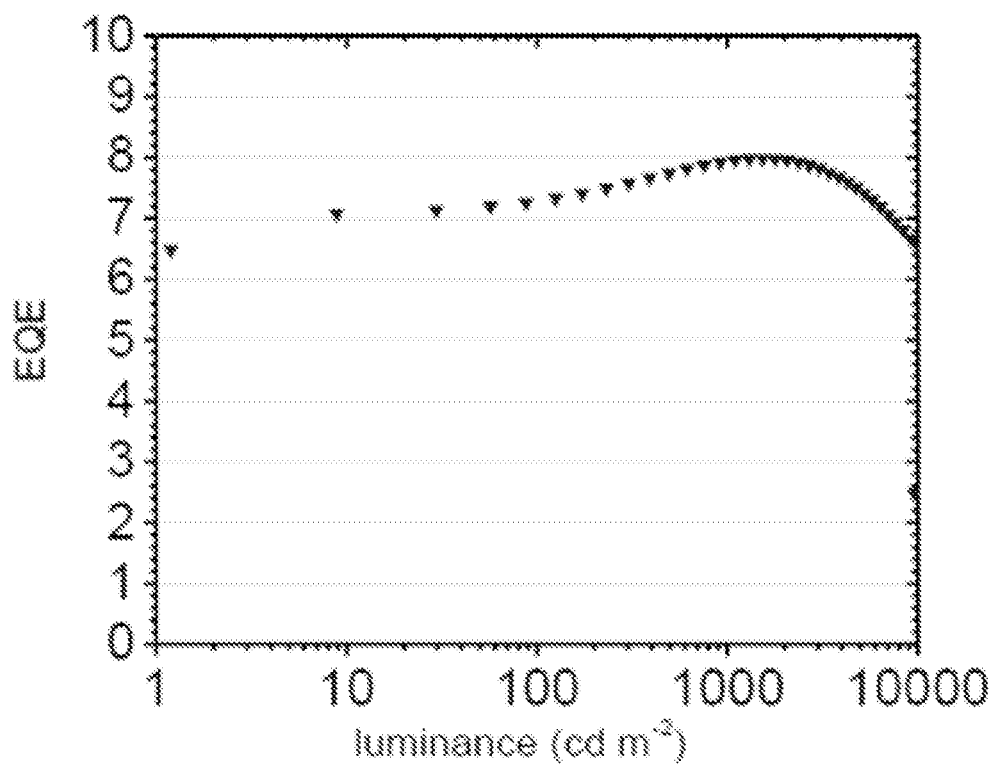
FIG. 6 shows the external quantum efficiency of the device of FIG. 3 vs. luminance.

The current density (left axis, upper trace) and luminance (right axis, lower trace) of the device against various applied voltages are shown in FIG. 4. The normalized electroluminescence intensity of the device is shown in FIG. 5, showing that the device emits at wavelengths between about 450 and 500 nm, e.g., blue light. The external quantum efficiency of the device vs. luminance is shown in FIG. 6. The external quantum efficiency at 1000 cd m$^{-2}$ is about 8% (FIG. 6).

Figure 7:
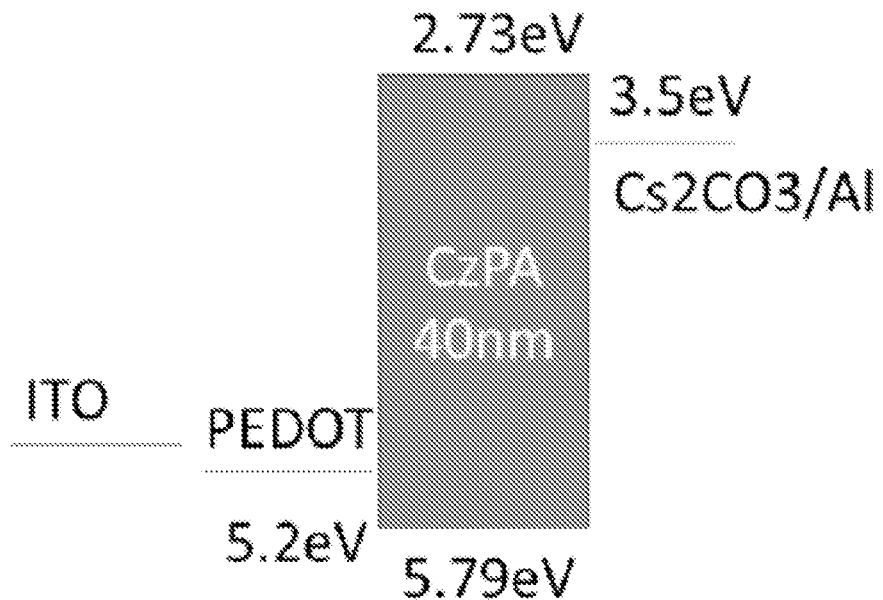
FIG. 7 is a schematic diagram of a control single layer device of the CzPA host using PEDOT as a hole injection layer.
Figure 8:
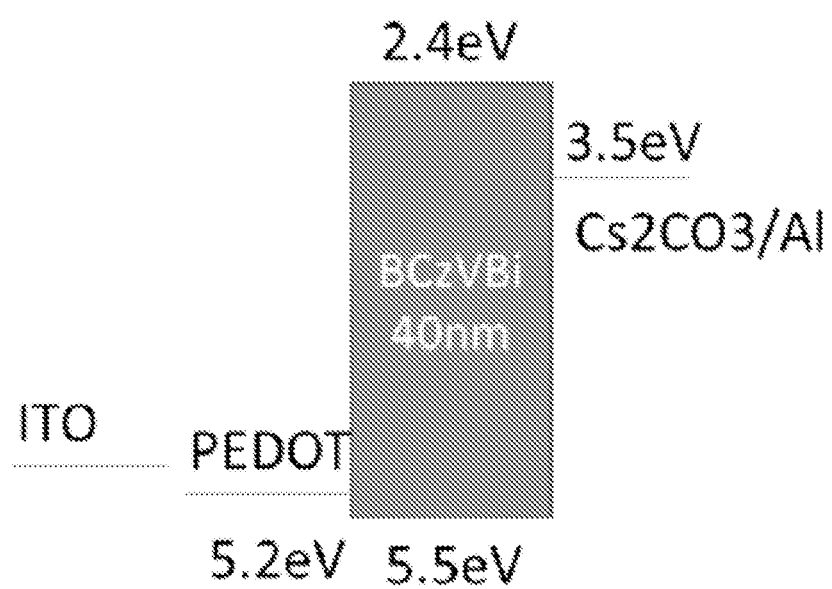
FIG. 8 is a schematic diagram of a control single layer device of the BCzVBi emitter using PEDOT as a hole injection layer.

For control experiments, single layer devices of the CzPA host or the BCzVBi emitter were prepared using PEDOT as a hole injection layer. The single layer device comprising CzPA is shown schematically in FIG. 7, and the single layer device comprising BCzVBi is shown schematically in FIG. 8.

Figure 9:
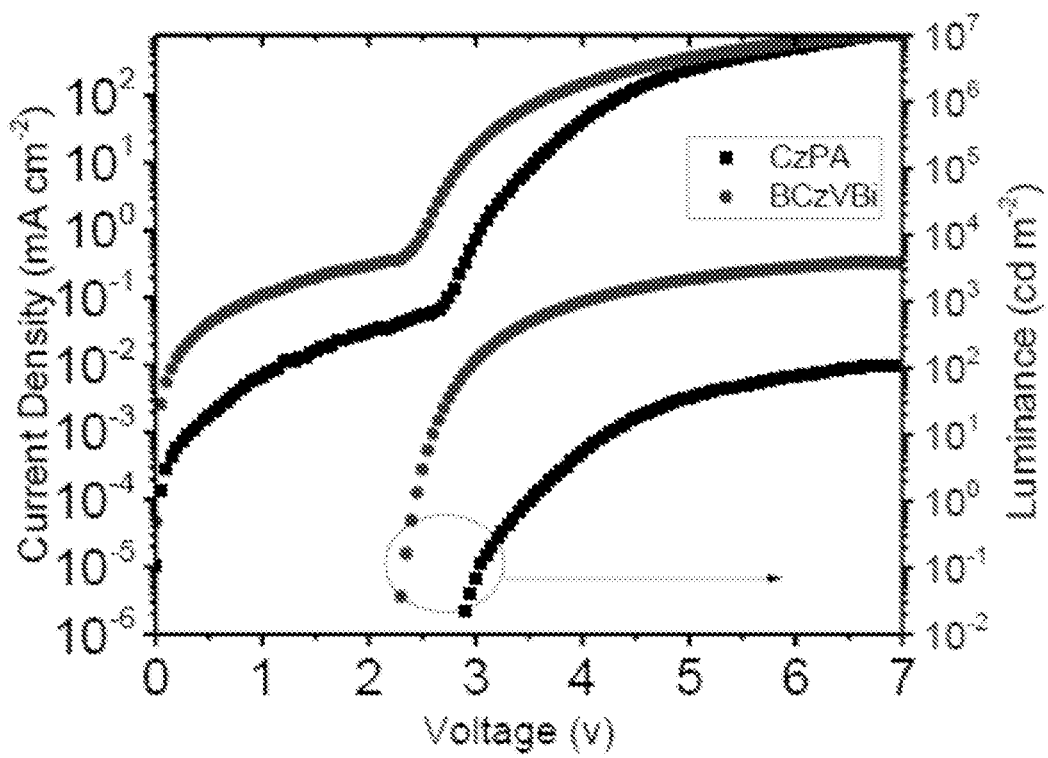
FIG. 9 shows the current density (left axis, upper two traces) and luminance (right axis, lower two traces) of the CzPA and BCzVBi devices shown in FIG. 7 and FIG. 8, respectively, against various applied voltages.
Figure 10:
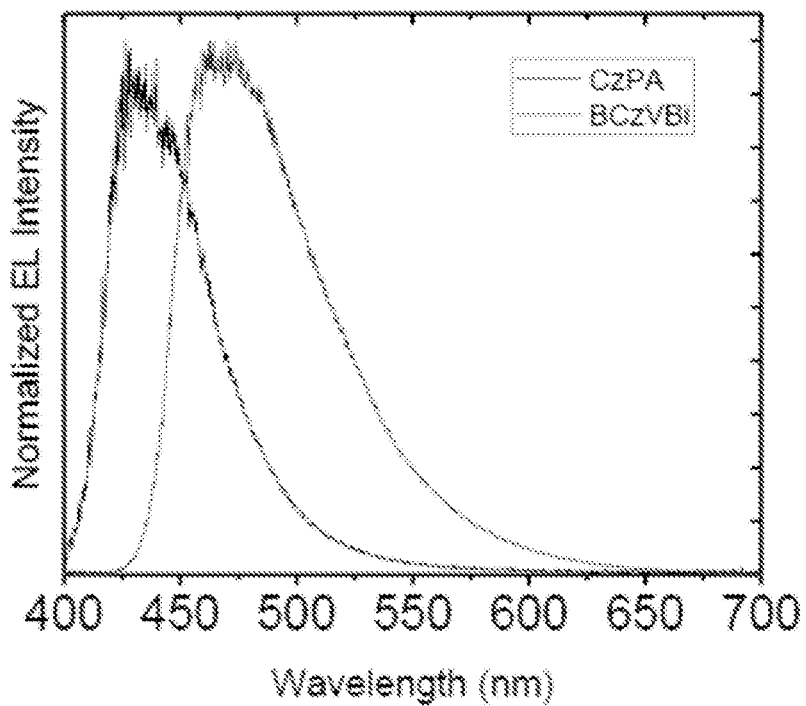
FIG. 10 shows the normalized electroluminescence intensity of the CzPA and BCzVBi devices shown in FIG. 7 and FIG. 8, respectively.

The current density (left axis, upper two traces) and luminance (right axis, lower two traces) of the CzPA and BCzVBi devices against various applied voltages are shown in FIG. 9. The normalized electroluminescence intensity of the CzPA and BCzVBi devices are shown in FIG. 10. Comparing FIG. 9 and FIG. 10, the CzPA device emits visible electroluminescence at wavelengths of from about 400 nm to 500 nm at an applied voltage of 2.8 volts, e.g., the CzPA device exhibits sub-bandgap electroluminescence. Similarly, FIG. 9 and FIG. 10 indicate that the BCzVBi device emits visible electroluminescence at wavelengths of from about 450 nm to 550 nm at an applied voltage of 2.1 volts, e.g., the BCzVBi device also exhibits sub-bandgap electroluminescence.

Figure 11:
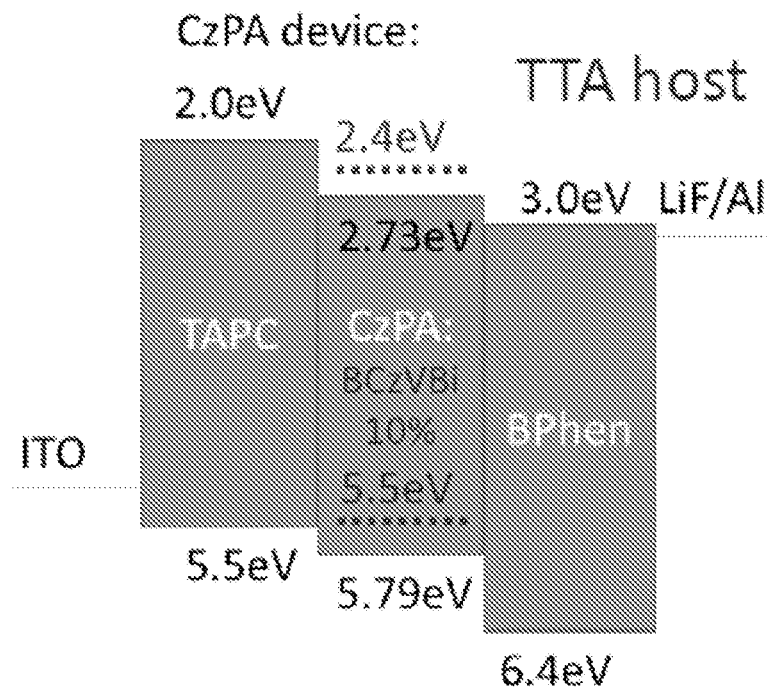
FIG. 11 is a schematic diagram of a device comprising a host material that exhibits triplet-triplet annihilation (CzPA).
Figure 12:
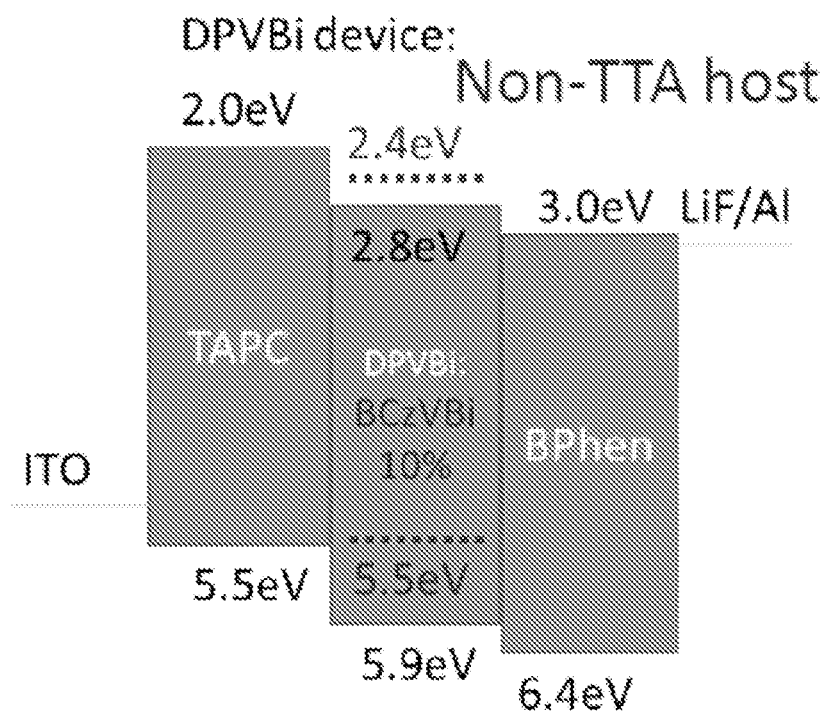
FIG. 12 is a schematic diagram of a device comprising a host material that does not exhibit triplet-triplet annihilation (DPVBi, 4,4'-bis(2,2-diphenylvinyl)-1,1'-biphenyl).
Figure 13:
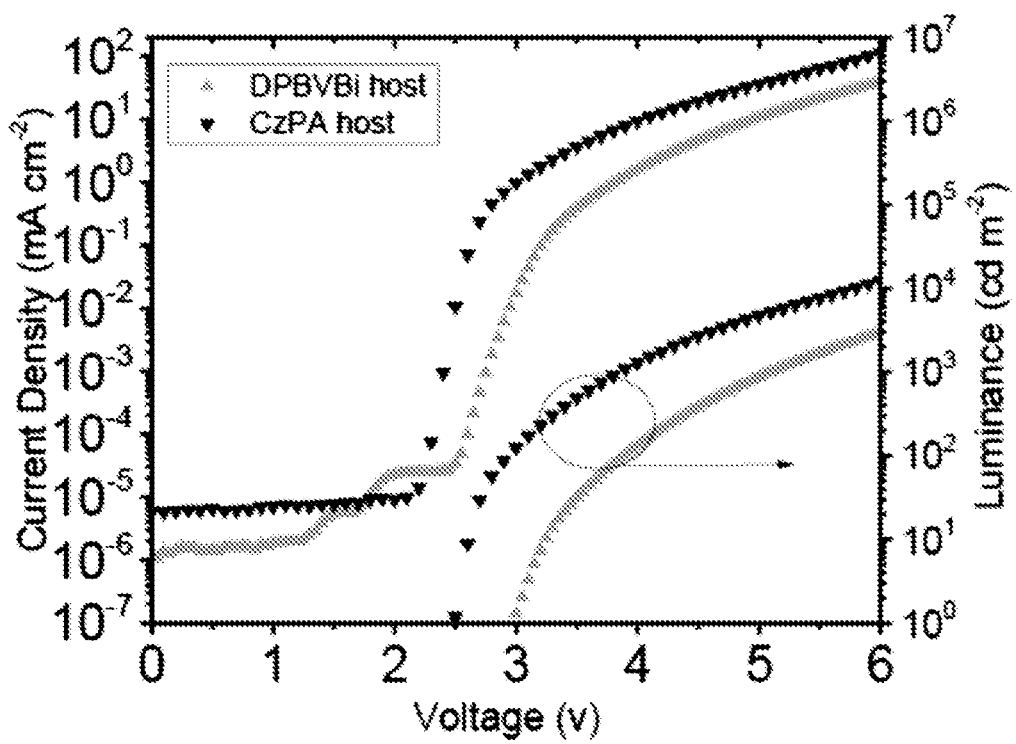
FIG. 13 shows the current density (left axis, upper two traces) and luminance (right axis, lower two traces) of the device comprising a host material that exhibits triplet-triplet annihilation (CzPA) shown in FIG. 11 and the device comprising a host material that does not exhibit triplet-triplet annihilation (DPVBi) shown in FIG. 12 at various voltages.
Figure 14:
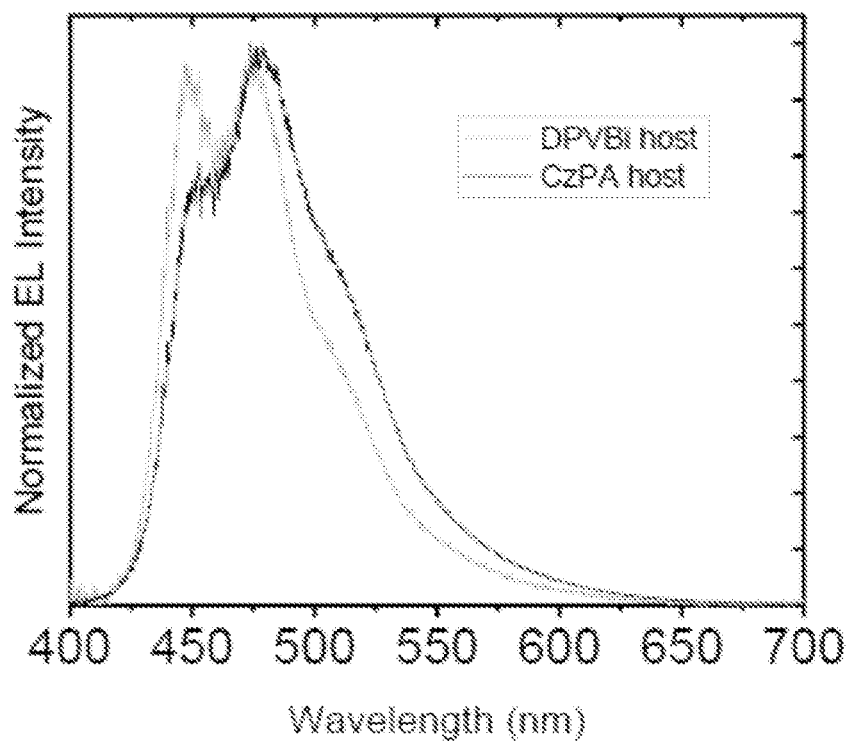
FIG. 14 shows the electroluminescence of the device comprising a host material that exhibits triplet-triplet annihilation (CzPA) shown in FIG. 11 and the device comprising a host material that does not exhibit triplet-triplet annihilation (DPVBi) shown in FIG. 12.
Figure 15:
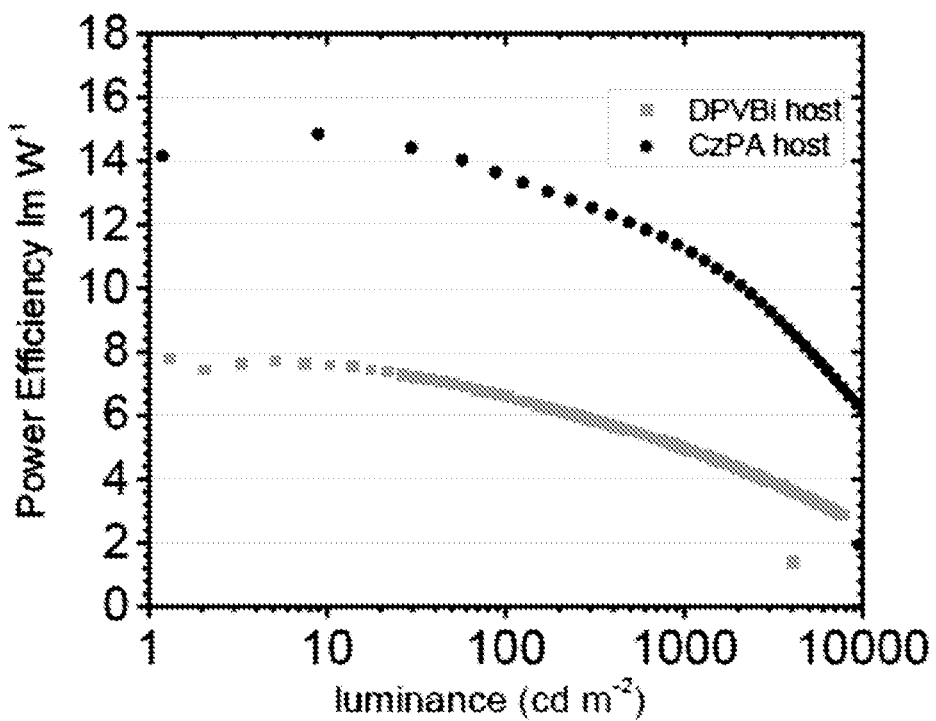
FIG. 15 shows the power efficiency of the device comprising a host material that exhibits triplet-triplet annihilation (CzPA) shown in FIG. 11 and the device comprising a host material that does not exhibit triplet-triplet annihilation (DPVBi) shown in FIG. 12.
Figure 16:
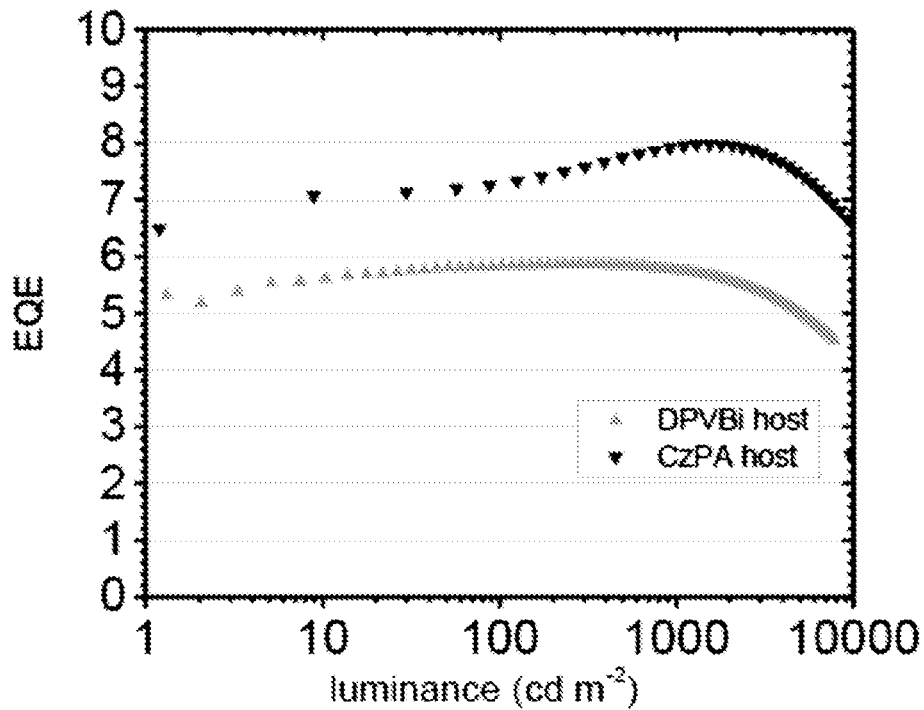
FIG. 16 shows the external quantum efficiency of the device comprising a host material that exhibits triplet-triplet annihilation (CzPA) shown in FIG. 11 and the device comprising a host material that does not exhibit triplet-triplet annihilation (DPVBi) shown in FIG. 12.

Further devices were fabricated to compare a device comprising a host material that exhibits triplet-triplet annihilation (CzPA, FIG. 11) with a device comprising a host material that does not exhibit triplet-triplet annihilation (DPVBi, 4,4'-bis(2,2-diphenylvinyl)-1,1'-biphenyl, FIG. 12). As can be seen from the current density and luminance results (FIG. 13), the electroluminescence (FIG. 14), the power efficiency (FIG. 15), and the external quantum efficiency (FIG. 16), both devices emitted at similar wavelengths but the device comprising a host material that exhibits triplet-triplet annihilation (CzPA) performed better than the device comprising a host material that does not exhibit triplet-triplet annihilation (DPVBi).

Figure 17:
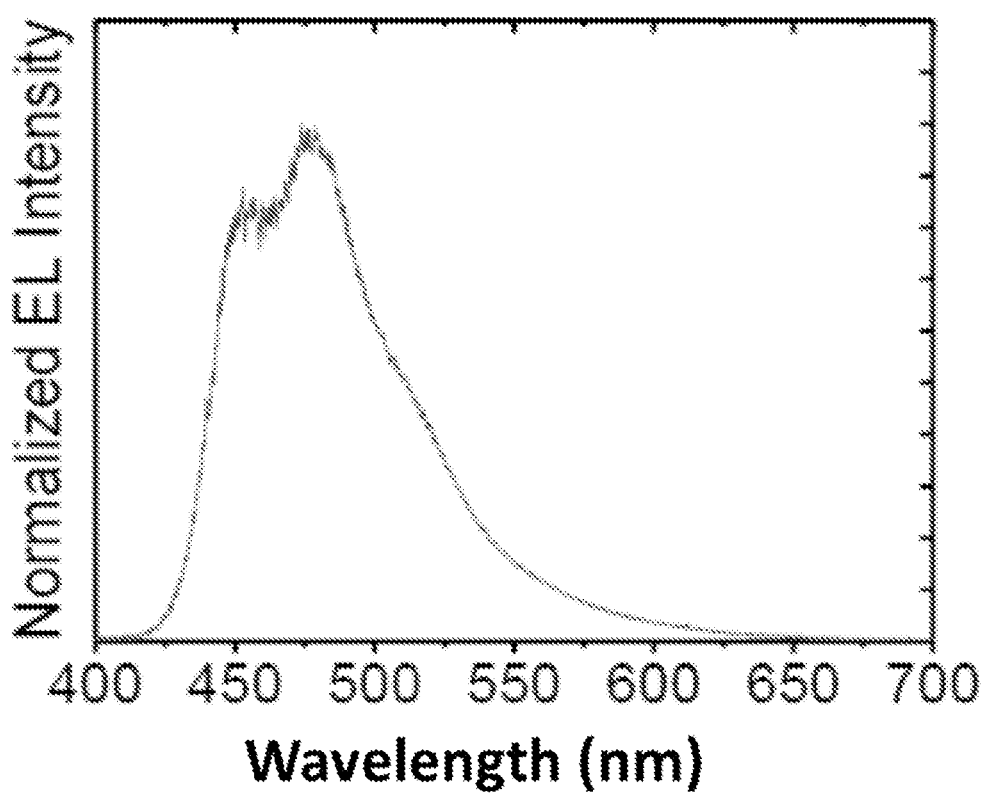
FIG. 17 shows the electroluminescence of an OLED device comprising BCzVBi as the emitter.

A OLED device comprising BCzVBi as the emitter was submitted to further testing. The electroluminescence of the device is shown in FIG. 17. The device exhibited a power efficiency of 16 lm/W at 100 cd/m$^2$, 15.1 lm/W at 500 cd/m$^2$, and 14.5 lm/W at 1000 cd/m$^2$ at an applied voltage of 3.5 V. Further, the device exhibited a turn-on voltage of only 2.5 volts, a maximum power efficiency of 16.4 lm/W, a power efficiency of 8.5 lm/W at 10,000 cd/m$^2$, a maximum external quantum efficiency of 9.8%, and an external quantum efficiency of 8.1% at 10,000 cd/m$^2$. Thus, the device exhibited a similar power efficiency as phosphorescent OLEDs but at an operating voltage that is about half that of phosphorescent OLEDs, indicating the devices described herein would exhibit a much better lifetime for blue light than the current phosphorescent OLEDs. Further, the devices described herein have a simpler device architecture compared to many phosphorescent OLEDS, meaning the devices describe wherein would have a reduced fabrication cost compared to the phosphorescent OLEDs.

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The methods of the appended claims are not limited in scope by the specific methods described herein, which are intended as illustrations of a few aspects of the claims and any methods that are functionally equivalent are intended to fall within the scope of the claims. Various modifications of the methods in addition to those shown and described herein are intended to fall within the scope of the appended claims. Further, while only certain representative method steps disclosed herein are specifically described, other combinations of the method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

What is claimed is:

1. An organic light emitting diode (OLED) device comprising:
   a transparent electrode;
   an optional hole injection layer;
   a hole transport layer;
   an emitting layer comprising:
      a host and an emitter,
      wherein the host exhibits triplet-triplet annihilation up-conversion,
      wherein the emitter has a band gap and exhibits triplet-triplet annihilation up-conversion,
      wherein the host and the emitter are different, and
      wherein the emitter has a concentration of 5% or more in the emitting layer;
   a triplet injection layer comprising the emitter;
   an electron transport layer;
   an optional electron injection layer; and
   a cathode;
   wherein:
      when the optional hole injection layer is present:
         the hole injection layer is in contact with the transparent electrode and the hole transport layer such that the hole injection layer is disposed between the transparent electrode and the hole transport layer; and
         the hole transport layer is in contact with the hole injection layer and the emitting layer such that the hole transport layer is disposed between the hole injection layer and the emitting layer; and
      when the optional hole injection layer is absent:
         the hole transport layer is in contact with the transparent electrode and the emitting layer such that the hole transport layer is disposed between the transparent electrode and the emitting layer;
   wherein the emitting layer is in contact with the hole transport layer and the triplet injection layer such that the emitting layer is disposed between the hole transport layer and the triplet injection layer;
   wherein the triplet injection layer is in contact with the emitting layer and the electron transport layer such that the triplet injection layer is disposed between the emitting layer and the electron transport layer; and
   wherein:
      when the optional electron injection layer is present:
         the electron transport layer is in contact with the triplet injection layer and the electron injection layer such that the electron transport layer is disposed between the triplet injection layer and the electron injection layer; and
         the electron injection layer is in contact with the electron transport layer and the cathode such that the electron injection layer is disposed between the electron transport layer and the cathode; and
      when the optional electron injection layer is absent:
         the electron transport layer is in contact with the triplet injection layer and the cathode such that the electron transport layer is disposed between the triplet injection layer and the cathode.

2. The OLED device of claim 1, wherein the optional hole injection layer is present and comprises dipyrazino[2,3-f:2',3'-h]quinoxaline-2,3,6,7,10,11-hexacarbonitrile (HAT-CN); 2,3,5,6-tetrafluoro-7,7,8,8-tetracyano-quinodimethane (F4-TCNQ); pyrazino[2,3-f] [1,10]phenanthroline-2,3-dicarbonitrile (PPDN); derivatives thereof; or combinations of thereof.

3. The OLED device of claim 1, wherein the optional hole injection layer is present and has an average thickness of from 0.1 nm to 30 nm.

4. The OLED device of claim 1, wherein the optional electron injection layer is present and comprises $Cs_2CO_3$, $Rb_2CO_3$, $ReO_3$, derivatives thereof, or combinations thereof.

5. The OLED device of claim 1, wherein the optional electron injection layer is present and has a thickness of from 0.1 nm to 30 nm.

6. The OLED device of claim 1, wherein the transparent electrode has an average thickness of from 10 nm to 200 nm; wherein the cathode has an average thickness of from 10 nm to 100 nm; or a combination thereof.

7. The OLED device of claim 1, wherein the hole transport layer comprises 4,4'-Cyclohexylidenebis[N,N-bis(4-methylphenyl)benzenamine] (TAPC), N,N'-Bis(naphthalen-1-yl)-N,N'-bis(phenyl)-benzidine (NPB), derivatives thereof, or combinations thereof.

8. The OLED device of claim 1, wherein the hole transport layer has an average thickness of from 10 nm to 200 nm.

9. The OLED device of claim 1, wherein the concentration of the emitter in the emitting layer is from 5% to 20%.

10. The OLED device of claim 1, wherein the host comprises anthracene, 9, 10-diphenylanthracene (DPA), 9-(4-(10-phenylanthracen-9-yl)phenyl)-9H-carbazole (CzPA), 1,1'-(2,5-Dimethyl-1,4-phenylene)dipyrene (DMPPP), derivatives thereof, or combinations thereof.

11. The OLED device of claim 1, wherein the emitter comprises 4,4'-Bis[4-(diphenylamino)styryl]biphenyl (BDAVBi); 4,4-bis[4-(di-p-tolylamino)styryl]biphenyl (DPAVBi); 1,4-bis(4-9H-carbazol-9-yl)styryl)benzene (BCzSB); 1,4-Di-[4-(N,N-diphenyl)amino]styryl-benzene (DSA-Ph); 4,4'-bis(4-(9H-carbazol-9-yl)styryl)biphenyl (BSB4); 4,4'-Bis(9-ethyl-3-carbazovinylene)-1,1'-biphenyl (BCzVBi); derivatives thereof; or combinations thereof.

12. The OLED device of claim 1, wherein the emitting layer has an average thickness of from 5 nm to 50 nm.

13. The OLED device of claim 1, wherein the triplet injection layer has an average thickness of from 1 nm to 10 nm.

14. The OLED device of claim 1, wherein the electron transport layer comprises bathophenanthroline (BPhen); 2,9-Bis(naphthalen-2-yl)-4,7-diphenyl-1,10-phenanthroline (NBPhen); 4,6-Bis(3,5-di(pyridin-3-yl)phenyl)-2-methylpyrimidine (B3PYMPM); 4,6-B is(3,5-di(pyridin-4-yl)phenyl)-2-methylpyrimidine (B4PYMPM); 1,3,5-Tris(1-phenyl-1Hbenzimidazol-2-yl)benzene (TPBi); Tris(8-hydroxyquinolinato)aluminum (Alq3); 2,4,6-Tris[3-(diphenylphosphinyl)phenyl]-1,3,5-triazine (POT2T); 2,4,6-tris(biphenyl-3-yl)-1,3,5-triazine (T2T); 1,3,5-Tri(p-pyrid-3-yl-phenyl)benzene (TpPyPB); tris(2,4,6-trimethyl-3-(pyridine-3-yl)phenyl)borane (3TPYMB); derivatives thereof; or combinations thereof.

15. The OLED device of claim 1, wherein the electron transport layer has an average thickness of from 5 nm to 100 nm.

16. A method of use of the OLED device of claim 1, the method comprising applying a voltage to the OLED device such that the OLED device emits light.

17. The method of claim 16, wherein the applied voltage is less than the band gap of the emitter.

18. The method of claim 16, wherein light emitted by the OLED device comprises blue light.

19. The method of claim 1, wherein the OLED device emits blue light via electroluminescence and has an operating voltage of 1 V or less at 1000 $cd/m^2$.

20. An article of manufacture comprising the OLED device of claim 1.

\* \* \* \* \*